(12) United States Patent
Yoshioka

(10) Patent No.: US 9,685,361 B2
(45) Date of Patent: Jun. 20, 2017

(54) CONTAINER TRANSPORT FACILITY

(71) Applicant: Daifuku Co., Ltd., Osaka-shi (JP)

(72) Inventor: Hideo Yoshioka, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 1 day.

(21) Appl. No.: 14/643,041

(22) Filed: Mar. 10, 2015

(65) Prior Publication Data

US 2015/0262855 A1    Sep. 17, 2015

(30) Foreign Application Priority Data

Mar. 11, 2014  (JP) ................. 2014-047450

(51) Int. Cl.
*H01L 21/677* (2006.01)
*H01L 21/673* (2006.01)

(52) U.S. Cl.
CPC .. *H01L 21/67769* (2013.01); *H01L 21/67379* (2013.01); *H01L 21/67775* (2013.01); *Y10S 414/135* (2013.01); *Y10S 414/14* (2013.01)

(58) Field of Classification Search
CPC ............. H01L 21/677; H01L 21/67775; H01L 21/67769; H01L 21/67379; B65G 1/0485; Y10S 414/135; Y10S 414/14
See application file for complete search history.

(56) References Cited

U.S. PATENT DOCUMENTS

| | | | | |
|---|---|---|---|---|
| 6,722,837 B2 * | 4/2004 | Inui | ...................... | B65G 1/0485 414/331.02 |
| 6,799,932 B2 * | 10/2004 | Davis | ................ | H01L 21/67173 414/217 |
| 7,914,248 B2 * | 3/2011 | Elliott | ............... | H01L 21/67379 294/2 |
| 8,348,584 B2 * | 1/2013 | Mizokawa | ........ | H01L 21/67763 414/225.01 |
| 8,814,488 B2 * | 8/2014 | Aburatani | ......... | H01L 21/67769 414/217 |
| 2002/0164232 A1 * | 11/2002 | Davis | ................ | H01L 21/67173 414/217.1 |
| 2003/0059284 A1 * | 3/2003 | Inui | ...................... | B65G 1/0485 414/331.02 |
| 2003/0198541 A1 * | 10/2003 | Davis | ................ | H01L 21/67173 414/217 |

(Continued)

FOREIGN PATENT DOCUMENTS

JP    200372917 A    3/2003

*Primary Examiner* — Andrew J Triggs
(74) *Attorney, Agent, or Firm* — The Webb Law Firm

(57) ABSTRACT

A support body includes a protrusion that protrudes in the horizontal direction from a base and passes through a notch in the vertical direction when a container is transferred, and the lateral width of the protrusion is formed to be narrower than the lateral width of the container. A small container and a large container configured to be wider than the small container in the lateral width direction exist as the container. The support body includes, as support body-side supporting parts, three support body-side small container supporting parts that support three small container supported parts located on the bottom surface of the small container, and a support body-side edge supporting part that supports an edge of the outer periphery of the bottom surface of the large container near the base.

7 Claims, 8 Drawing Sheets

(56) References Cited

U.S. PATENT DOCUMENTS

| | | | |
|---|---|---|---|
| 2008/0056860 A1* | 3/2008 | Natume | ............... B66F 11/00 414/222.01 |
| 2009/0053019 A1* | 2/2009 | Osaki | ............ H01L 21/67775 414/222.01 |
| 2015/0262855 A1* | 9/2015 | Yoshioka | ......... H01L 21/67769 414/277 |

* cited by examiner

CONTAINER TRANSPORT FACILITY

CROSS-REFERENCE TO RELATED APPLICATION

This application claims priority to Japanese Patent Application No. 2014-047450 filed Mar. 11, 2014, the disclosure of which is hereby incorporated in its entirety by reference.

FIELD OF THE INVENTION

The present invention relates to a container transport facility including: a transfer unit including a movement operation part that moves, at least in a vertical direction, a support body that supports from below a container in which an opening for placing a semiconductor substrate in and out is disposed at the front thereof; and a plate-shaped placement body as a transfer target location to which the container is transferred by the transfer unit, wherein the support body includes support body-side supporting parts that support a bottom surface of the container in a state in which the container is positioned at a transfer position in the support body, the placement body includes a notch having a recessed shape in plan view and a plurality of placement body-side supporting parts distributed at different positions in a direction along a peripheral edge of the notch in plan view, and is configured to receive and support the bottom surface of the container in a state in which the container is positioned relative to the placement body in a lateral width direction by the plurality of placement body-side supporting parts as a result of a portion of the support body that supports the container passing through the notch downwardly.

BACKGROUND

Such a container transport facility is used for transporting substrate transporting containers in a semiconductor processing facility. For example, JP 2003-72917 (Patent Document 1) discloses a case where containers are transported within a storage facility provided in a semiconductor processing facility. As described in Patent Document 1, the semiconductor processing facility is provided with an inter-process transport facility that transports a container housing a semiconductor substrate to be processed, between a plurality of processing devices that perform a plurality of steps in a shared manner. The storage facility is provided for temporarily storing the container when the container is transported between the processes the by inter-process transport facility.

The storage facility is provided with a plurality of placement bodies that temporarily store the container. A transfer unit that transfers the container between the plurality of placement bodies and itself is provided. Also, when the container is delivered to or received from a placement body by the transfer unit, a support body that supports the container is lowered in a state in which a portion of the support body overlaps in plan view with a notch of the placement body such that the support body passes through the notch of the placement body from the upper side to the lower side. Consequently, as the support body is lowered, the container supported by the support body is supported by the placement body at least at opposite end portions of the bottom surface of the container in a lateral width direction thereof.

SUMMARY OF THE INVENTION

Traditionally, disk-shaped semiconductor substrates (wafers) having a diameter of 300 mm have been mainly used. For this reason, a 300 mm wafer FOUP (Front-Opening Unified Pod: hereinafter referred to as a "300 mm FOUP") having a shape prescribed in the SEMI (Semiconductor Equipment and Materials International) standards is used as a container housing a semiconductor substrate, and the support body and the placement body of the container transport facility have been configured to have shapes and dimensions suitable for supporting a 300 mm FOUP.

On the other hand, to improve the productivity or the production efficiency, disk-shaped wafers having a diameter of 450 mm have started to be produced in recent years, and the container transport facility now needs to transport a 450 mm wafer container (hereinafter referred to as a "450 mm FOUP") that has a shape prescribed in the SEMI standards and is wider than the 300 mm FOUP in the lateral width direction as a container housing a semiconductor substrate.

The SEMI standards prescribe that each of the 300 mm FOUP and the 450 mm FOUP described above includes three supported parts distributed on the bottom surface of a container such that the container is positioned so as to be placed at a proper position (hereinafter referred to as a "proper placement position") relative to the support body when the container is supported by the support body. The three supported parts include a pair of supported parts spaced apart in the lateral width direction of the container (hereinafter referred to as a "pair of forward supported parts") and a supported part located at a position that is at a central portion in the lateral width direction of the container and is spaced toward the rear of the container relative to the pair of forward supported parts (hereinafter referred to as a "rearward supported part").

Also, the pair of forward supported parts of a 300 mm FOUP when the support body supports the 300 mm FOUP are located inward, in plan view, of the pair of forward supported parts of a 450 mm FOUP in the lateral width direction of the containers (the lateral width direction of the support body) when the support body supports the 450 mm FOUP.

Meanwhile, separately providing the transfer unit and the placement body for a 300 mm FOUP and the transfer unit and the placement body for a 450 mm FOUP will lead to an increase in the cost of the facility, and it is therefore desirable to use the same transfer unit and placement body for a 300 mm FOUP and a 450 mm FOUP.

However, with a configuration in which the support body is merely provided with both supporting parts that support the forward supported parts of a small container and supporting parts that support the forward supported parts of a large container, the dimension of the support body in the lateral width direction is set according to the interval between the pair of forward supported parts of the large container. Accordingly, if a notch through which the support body including the supporting parts that support the forward supported parts of the large container can pass through in the vertical direction is formed in the placement body, it will be difficult to provide the placement body with the placement body-side supporting parts that support the pair of forward supported parts of the small container. This may result in the problem that the small container cannot be appropriately transferred from the support body to the placement body although the large container can be supported.

Therefore, there has been a need to achieve a container transport facility that includes a transfer unit capable of properly supporting both a small container and a large container by a support body, while being capable of appropriately transferring both the small container and the large container to a placement body.

A container transport facility according to the present invention includes: a transfer unit including a support body that supports from below a container in which an opening for placing a semiconductor substrate in and out is disposed at a front thereof, and a movement operation part that moves the support body at least in a vertical direction; and a plate-shaped placement body as a transfer target location to which the container is transferred by the transfer unit, wherein the support body includes support body-side supporting parts that support a bottom surface of the container in a state in which the container is positioned at a transfer position in the support body, the placement body includes a notch having a recessed shape in plan view and a plurality of placement body-side supporting parts distributed at different positions in a direction along a peripheral edge of the notch in plan view, and is configured to receive and support the bottom surface of the container in a state in which the container is positioned relative to the placement body in a lateral width direction by the plurality of placement body-side supporting parts as a result of a portion of the support body that supports the container passing through the notch downwardly, the support body includes a base to which the movement operation part is connected, and a protrusion that protrudes from the base in a horizontal direction and passes through the notch in the vertical direction when the container is transferred, and is configured to support the container in an orientation in which a front-to-rear direction of the container extends along a protruding direction of the protrusion, a lateral width of the protrusion is formed to be narrower than a lateral width of the container, a small container and a large container configured to be wider than the small container in the lateral width direction exist as the container, the small container includes three small container supported parts distributed on a bottom surface thereof, the three small container supported parts including a pair of small container forward supported parts spaced apart in a lateral width direction of the small container and a small container rearward supported part located at a position that is at a central portion in the lateral width direction of the small container and is spaced toward a rear of the small container relative to the pair of small container forward supported parts, the large container includes three large container supported parts distributed on a bottom surface thereof, the three large container supported parts including a pair of large container forward supported parts spaced apart in a lateral width direction of the large container and a large container rearward supported part located at a position that is at a central portion in the lateral width direction of the large container and is spaced toward a rear of the large container relative to the pair of large container forward supported parts, the pair of small container forward supported parts in a state in which the support body supports the small container are located inward, in plan view, of the pair of large container forward supported parts in a lateral width direction of the support body in a state in which the support body supports the large container, and the support body includes, as the support body-side supporting parts, three support body-side small container supporting parts that support the three small container supported parts located on the bottom surface of the small container and a support body-side edge supporting part that supports an edge of an outer periphery of the bottom surface of the large container near the base.

That is, the support body can support the small container in a state in which the small container is positioned at a proper placement position by the three support body-side small container supporting parts that support the three small container supported parts located on the bottom surface of the small container, and also can support the large container in a state in which the large container is positioned at a proper placement position by the support body-side edge supporting part that support the edge of the outer periphery of the bottom surface of the large container near the base.

Also, the lateral width of the protrusion of the support body is formed to be narrower than the lateral width of the small container. Accordingly, when the small container supported by the support body is transferred to the placement body, the small container can be supported by the plurality of placement body-side supporting parts distributed at different positions in the direction along the peripheral edge of the notch by operating the movement operation part such that the protrusion of the support body that supports the small container passes through the notch of the placement body downwardly.

Since the support body is provided with the support body-side edge supporting part that supports the edge of the outer periphery of the bottom surface of the large container near the base, it is possible to stably support the large container by providing the protrusion with a supporting part that supports the bottom surface of the large container. When the large container supported by the support body is transferred to the placement body, the large container can be supported by the plurality of placement body-side supporting parts distributed at different positions in the direction along the peripheral edge of the notch by operating the movement operation part such that the protrusion of the support body that supports the large container passes through the notch of the placement body downwardly.

Thus, it is possible to achieve a container transport facility that includes a transfer unit capable of properly supporting both a small container and a large container by a support body, while being capable of appropriately transferring both the small container and the large container to a placement body.

The following is a description of preferred embodiments of the present invention.

In an embodiment of the container transport facility according to the present invention, it is preferable that a plurality of the support body-side edge supporting parts are distributed in the lateral width direction of the support body.

That is, the support body-side edge supporting parts support the edge of the outer periphery of the bottom surface of the large container near the base at a plurality of locations distributed in the lateral width direction of the support body, and it is therefore possible to stabilize the orientation of the forward portion of the large container in the lateral width direction.

Accordingly, it is possible to support the large container by the support body in a stable orientation even when the transfer unit is moved by the movement operation part to transfer the large container to the placement body.

In an embodiment of the container transport facility according to the present invention, it is preferable that the plurality of the support body-side edge supporting parts are provided so as to support portions of the edge of bottom surface of the large container near the base, the portions being located on opposite sides with respect to the protrusion in the lateral width direction of the support body.

That is, the plurality of support body-side edge supporting parts support portions of the edge of the bottom surface of the large container near the base, the portions being located at opposite sides with respect to the protrusion in the lateral width direction of the support body. Thereby, it is possible to support the large container by the support body in a more stable orientation.

In an embodiment of the container transport facility according to the present invention, it is preferable that a support body-side large container supporting part that supports the large container rearward supported part of the large container is provided at a tip of the protrusion, and the support body is configured to support the large container with the support body-side edge supporting part and the support body-side large container supporting part.

That is, the large container is supported by the support body-side large container supporting part provided at the tip of the protrusion and the support body-side edge supporting part.

Here, since the support body-side large container supporting part supports a single large container rearward supported part located at the central portion in the lateral width direction of the container, it is not necessary to increase the dimension of the protrusion in the lateral width direction of the container. Accordingly, it is possible to reduce the dimension of the protrusion in the lateral width direction of the container. Also, the support body supports the large container with both the support body-side large container supporting part and the support body-side edge supporting part, and it is therefore possible to support the large container in a stable orientation.

Thus, it is possible to achieve a container transport facility that includes the transfer unit capable of properly supporting a large container by the support body and appropriately transferring the large container to the placement body.

In an embodiment of the container transport facility according to the present invention, it is preferable that the support body-side edge supporting part and the support body-side large container supporting part are configured to support the large container at a height at which the bottom surface of the large container is located above upper ends of the support body-side small container supporting parts.

That is, when the large container is supported by the support body-side edge supporting part and the support body-side large container supporting part of the support body, the bottom surface of the large container will not interfere with the support body-side small container supporting parts. Accordingly, it is possible to achieve a support body including the support body-side small container supporting parts for supporting a small container, while being capable of appropriately supporting a large container as well.

In an embodiment of the container transport facility according to the present invention, it is preferable that the placement body includes, as the placement body-side supporting parts, placement body-side small container supporting parts capable of supporting the bottom surface of the small container in a state in which the small container is positioned at a small container set placement position, the placement body-side small container supporting parts include a pair of placement surfaces that are provided so as to be spaced apart on opposite sides of the notch of the placement body in the lateral width direction of the placement body in plan view and that support the bottom surface of the small container from below, a pair of small container engaging parts for engaging with the pair of small container forward supported parts, and a pair of small container positioning members, and the small container positioning members each include a restriction surface that restricts movement of the small container along the lateral width direction of the placement body by coming into contact with a side portion of the small container, and a guiding inclined part that guides an end of the bottom surface of the small container in the lateral width direction to position the small container at the small container set placement position in the lateral width direction of the placement body.

That is, the small container is stably supported by the placement body in a state in which the inclination in the lateral width direction of the small container is suppressed by the pair of placement surfaces that are provided so as to be spaced apart on opposite sides of the notch of the placement body in the lateral width direction of the placement body in plan view and that support the bottom surface of the small container from below.

In addition, even if the position of the small container in the lateral width direction is displaced from the small container set placement position when the small container is transferred from the support body to the placement body, the small container can be appropriately guided to the small container set placement position by the guiding inclined parts of the pair of small container positioning members.

Furthermore, in a state in which the small container is placed on the placement body, the small container is appropriately positioned at the small container set placement position in the front-rear direction and the lateral width direction of the placement body by the pair of small container engaging parts and the restriction surfaces of the pair of small container positioning members.

Thus, it is possible to achieve a placement body capable of appropriately supporting a small container in a state in which the small container is positioned at the small container set placement position.

In an embodiment of the container transport facility according to the present invention, it is preferable that the placement body includes, as the placement body-side supporting parts, placement body-side large container supporting parts capable of supporting the bottom surface of the large container in a state in which the large container is positioned at a large container set placement position, the placement body-side large container supporting parts include a pair of large container supporting and positioning members that are provided so as to be spaced apart on opposite sides of the notch of the placement body in the lateral width direction of the placement body in plan view and that support a pair of supported locations of the bottom surface of the large container that are spaced apart in the lateral width direction of the large container, and a large container rearward supporting part that supports the large container rearward supported part, and the large container supporting and positioning members each include a placement surface that supports the bottom surface of the large container from below, a restriction surface that restricts movement of the large container along the lateral width direction of the placement body by coming into contact with a side portion of the large container, and a guiding inclined part that guides an end of the bottom surface of the large container in the lateral width direction to position the large container at the large container set placement position in the lateral width direction of the placement body.

That is, the large container is stably supported by the placement body in a state in which the inclination of the container in the lateral width direction is suppressed by the placement surfaces respectively provided on the pair of large container supporting and positioning members that are provided so as to be spaced apart on opposite sides of the notch of the placement body in the lateral width direction of the placement body in plan view, and the large container rearward supporting part that supports the large container rearward supported part.

In addition, even if the position of the large container is displaced from the large container set placement position when the large container is transferred from the support body to the placement body, the large container can be appropriately guided to the large container set placement position by the guiding inclined parts of the pair of large container supporting and positioning members.

Furthermore, in a state in which the large container is placed on the placement body, the large container is appropriately positioned at the large container set placement position in the lateral width direction of the placement body by the restriction surfaces of the pair of large container supporting and positioning members.

Thus, it is possible to achieve a placement body capable of appropriately supporting a large container in a state in which the large container is positioned at the large container set placement position.

In an embodiment of the container transport facility according to the present invention, it is preferable that the placement body-side large container supporting parts are configured to support the large container at a height at which the bottom surface of the large container is located above upper ends of the small container engaging parts.

That is, in a state in which the large container is supported by the placement body-side large container supporting parts of the placement body, the bottom surface of the large container will not interfere with the small container engaging parts. Accordingly, it is possible to achieve a placement body including the small container engaging parts for supporting a small container, while being capable of appropriately supporting a large container as well.

In an embodiment of the container transport facility according to the present invention, it is preferable that the pair of small container positioning members and the pair of large container supporting and positioning members are formed by a single pair of members.

That is, by forming the pair of the small container positioning members and the pair of large container supporting and positioning members with a single pair of members, it is possible to achieve a simplified configuration by reducing the number of members, and also to simplify operations such as an attachment operation.

DETAILED DESCRIPTION

With reference to the drawings, a description will be given of a case where a container transport facility according to the present invention is applied to a semiconductor container storage facility.

Figure 1:
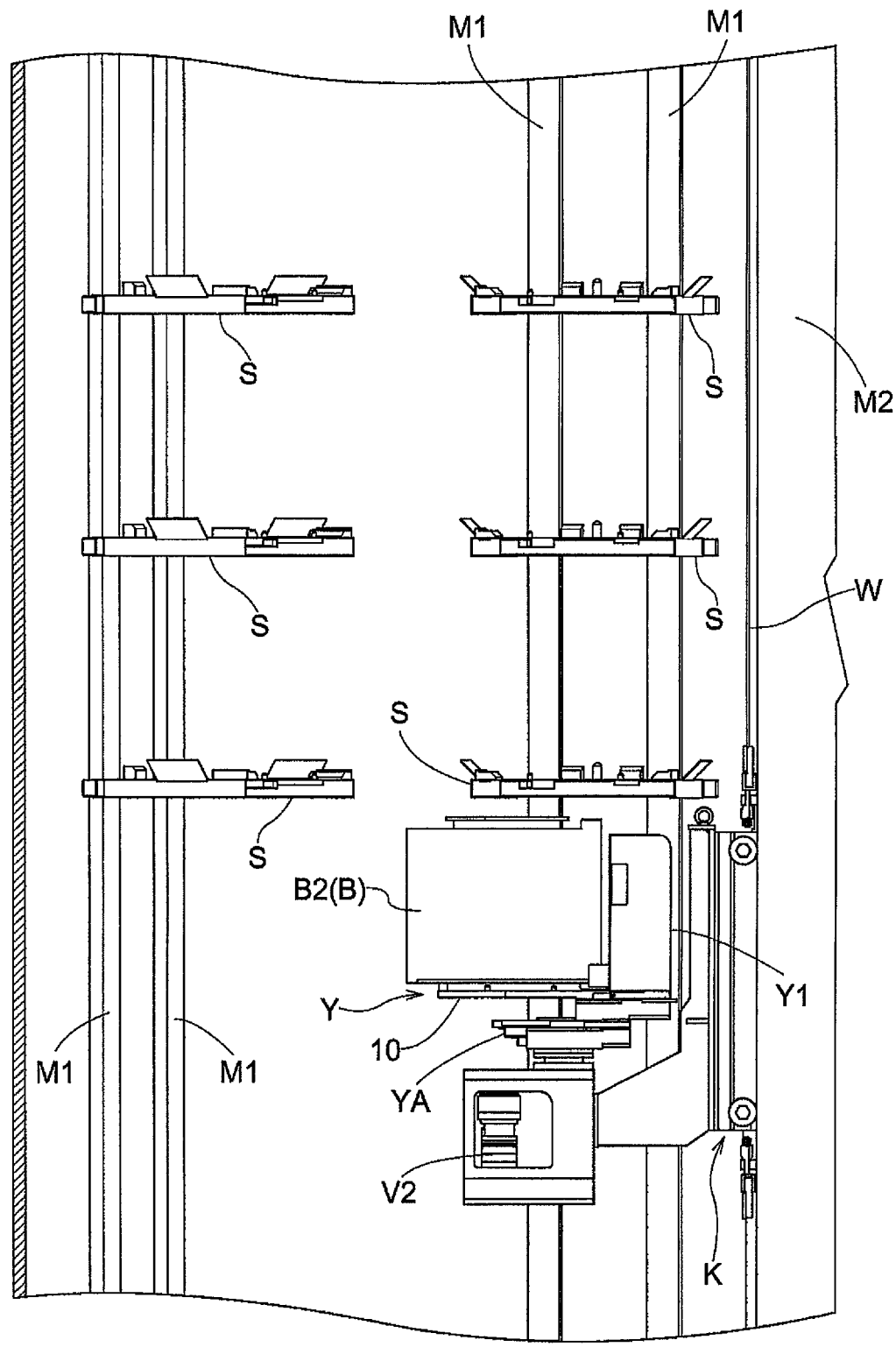
FIG. 1 is a side view showing relevant portions of a semiconductor container storage facility including a container transport facility.
Figure 2:
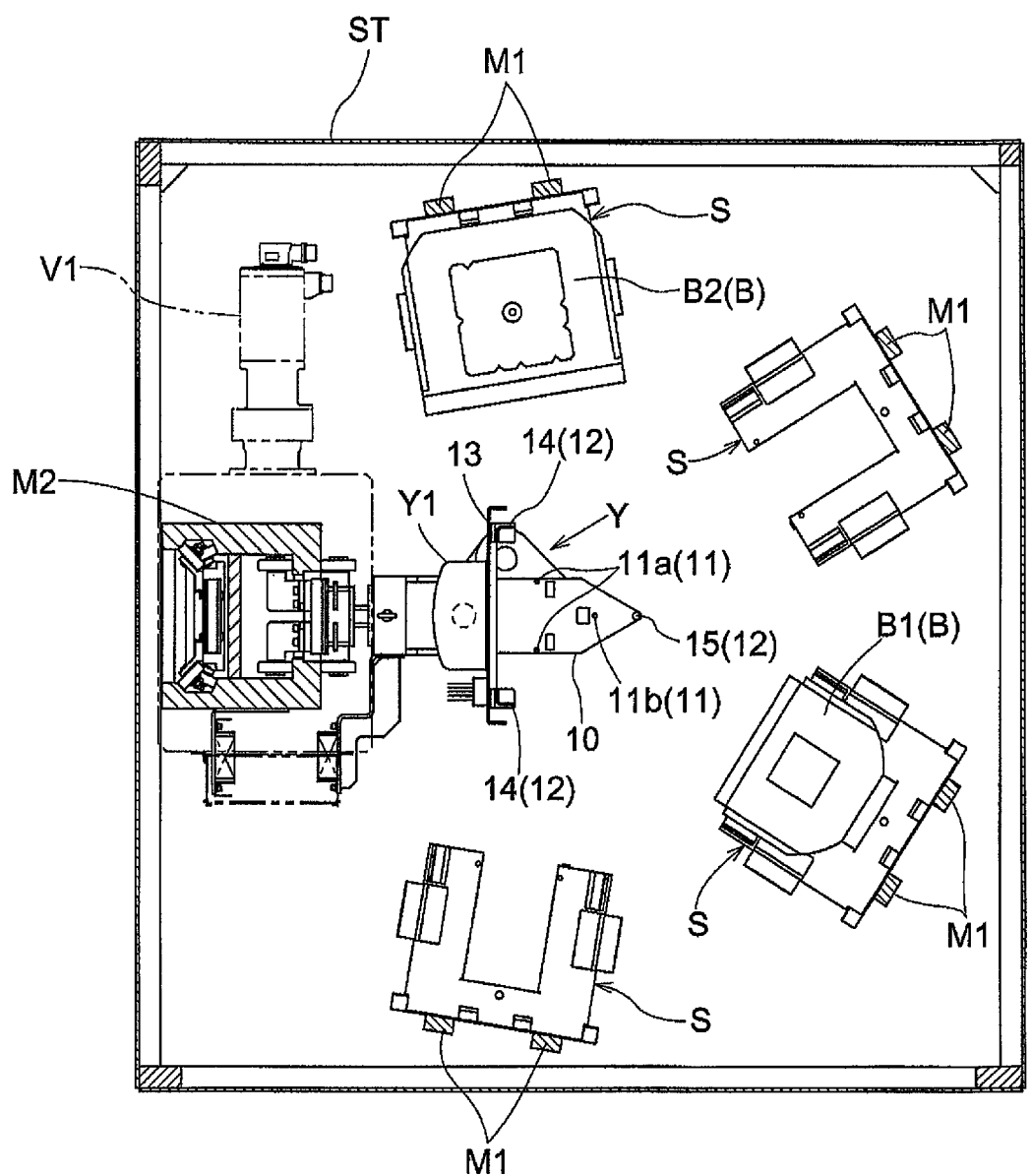
FIG. 2 is a plan view of the semiconductor container storage facility including the container transport facility.

As shown in FIGS. 1 and 2, a substrate container storage facility ST includes, in its interior surrounded by a wall body, a plurality of placement bodies S that support from below containers B (substrate transporting containers that are prescribed in the SEMI standards and are generally called "FOUPs") that house semiconductor wafers in a sealed state.

Figure 3:
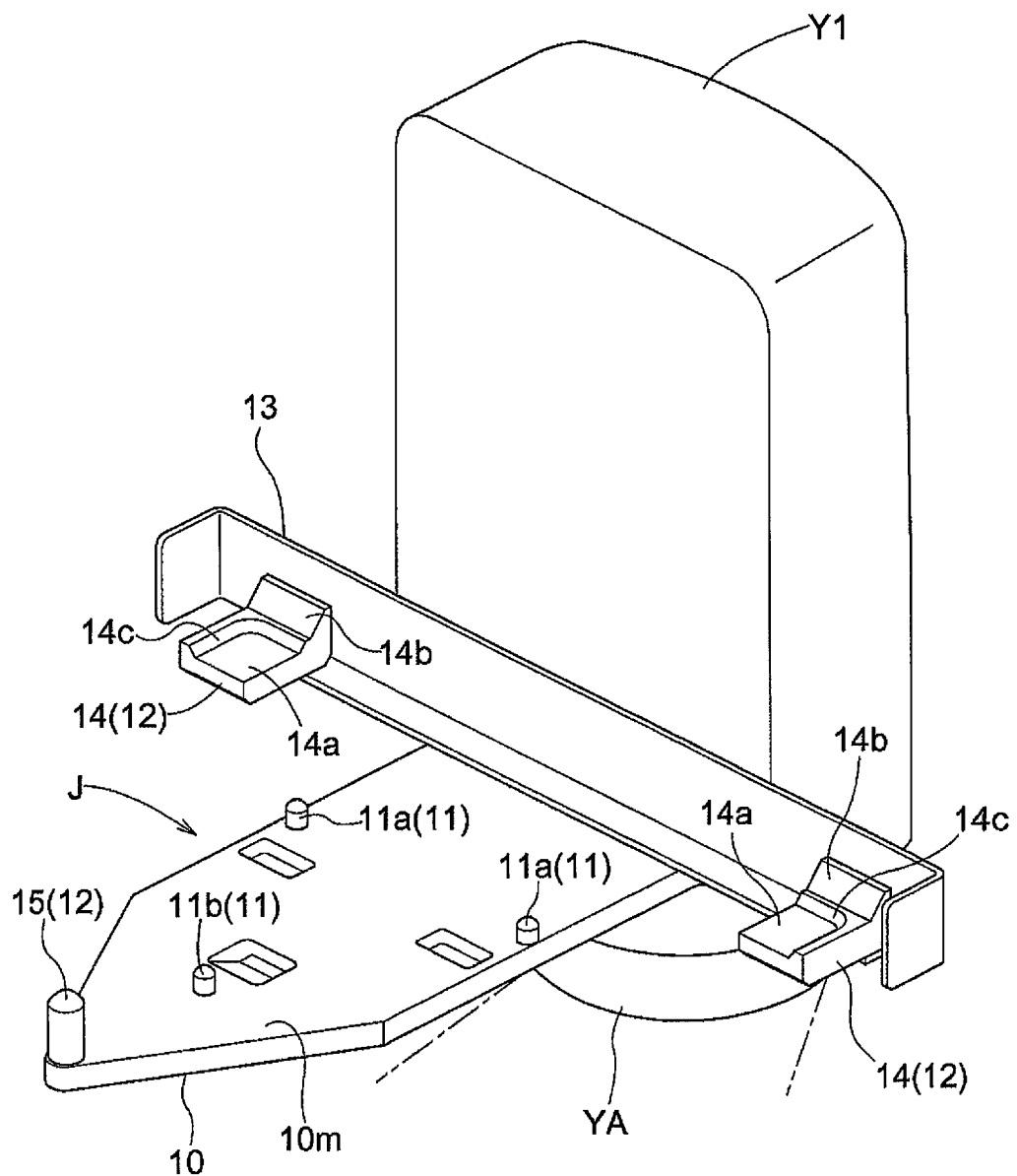
FIG. 3 is a perspective view partially showing a support body and a movement operation part.
Figure 4:
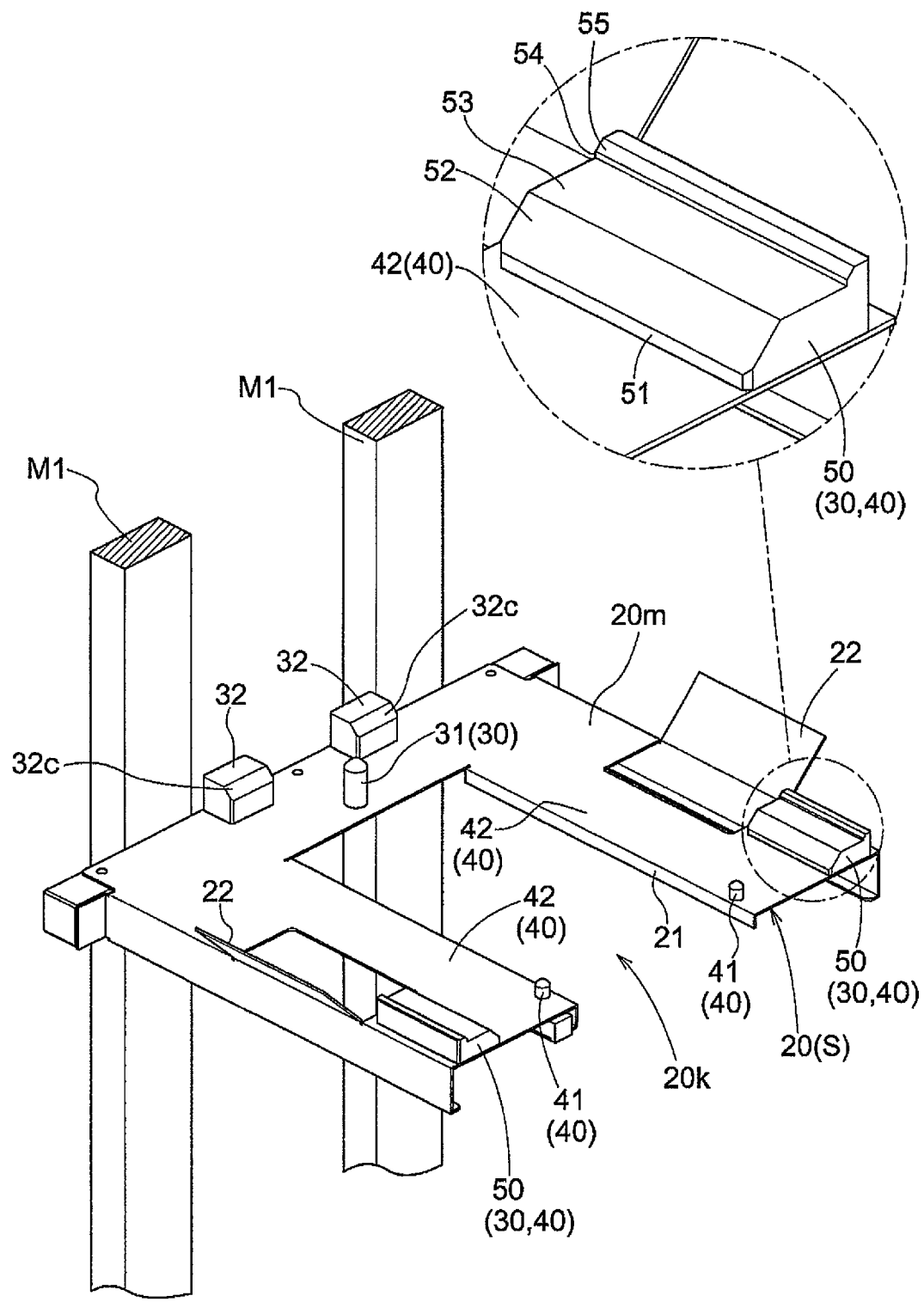
FIG. 4 is a perspective view showing the configuration of a placement body.

Each placement body S is a transfer target location to which a container B is transferred by a transfer unit Y, which will be described later, and is constituted by a plate-shaped member 20 having a rectangular shape in plan view as shown in FIG. 4. The plate-shaped member 20 is provided with a notch forming part 21. The notch forming part 21 forms a notch 20k that is recessed in plan view and through which a support body J (see FIG. 3), which will be described later, can pass in the vertical direction. The notch 20k is formed in a recessed shape in plan view. Also, when the container B is transferred between a support body J and a placement body S, the support body J and the placement body S are oriented such that the protruding direction of a protrusion 10 of the support body J from a base 13 is opposite to the opening direction of the notch 20k of the placement body S to which the container is to be transferred. As shown in FIG. 2, the placement body S is provided at each of four positions such that the notch 20k of the plate-shaped member 20 faces the central portion of the substrate container storage facility ST in plan view. As shown in FIG. 1, a plurality of the placement bodies S are provided so as to be spaced apart in the vertical direction such that they are supported by struts M1 extending along the vertical direction.

Here, a description will be given of the container B that is to be transported by the container transport facility.

In the present embodiment, the container transport facility is configured to be capable of transporting a 300-mm-diameter-wafer small container B1 prescribed in a SEMI standard (E47.1) and a 450-mm-diameter-wafer large container B2 prescribed in a SEMI standard (E158). The small container B1 and the large container B2 are front-opening containers in which an opening for placing a semiconductor substrate in and out is disposed at the front thereof.

Figure 6:
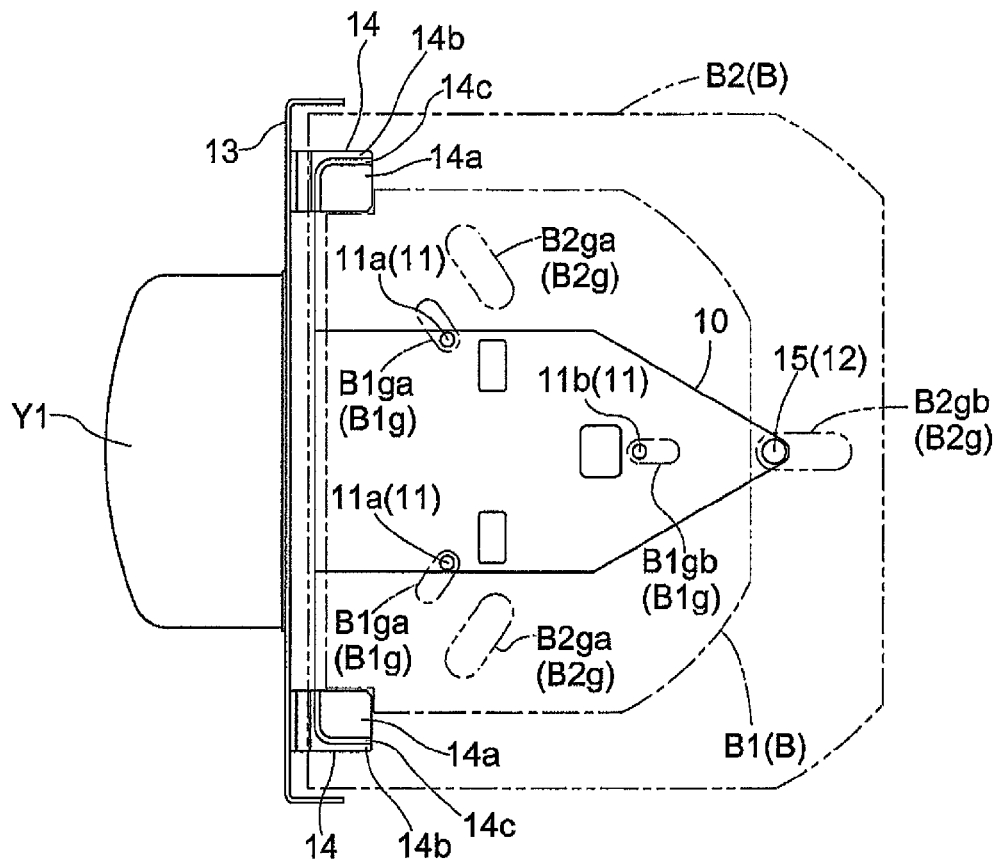
FIG. 6 is a plan view showing a positional relationship between the support body and a large container and a small container that are supported by the support body.

As shown in FIG. 6, the small container B1 includes three small container supported parts B1g distributed on the bottom surface thereof, based on a SEMI standard (E57). Each of the small container supported parts B1g is formed in the shape of a long groove extending radially from the center of the bottom surface of the small container B1 in plan view (as viewed in the vertical direction). The center of the bottom surface may be, for example, a portion corresponding to the center of gravity of the bottom surface as a geometric figure, or a portion of the bottom surface that overlaps in plan view with the center of gravity (center of mass) of the container. Each of the small container supported parts B1g is formed so as to be recessed to the inner side (upper side) of the container toward the central portion of its groove-shaped portion, and the peripheral edge portion of the groove-shaped portion is configured to be continuous with a bottom surface B1m of the small container B1 without any level difference. The three small container supported parts B1g include a pair of small container forward supported parts B1ga spaced apart in the lateral width direction of the small container B1 and a small container rearward supported part B1gb located at a position that is at a central portion in the lateral width direction of the small container B1 and is spaced toward the rear of the small container B1 (to the right side in FIG. 6) relative to the pair of small container forward supported parts B1ga. The pair of small container forward supported parts B1ga are disposed forward (to the left side in FIG. 6) of the center of the small container B1 in plan view, and the small container rearward supported part B1gb is disposed rearward of the center of the small container B1 in plan view. The center of the container may be, for example, the center of gravity of the contour of the container as a geometric figure in plan view, the center of gravity of the bottom surface as a geometric figure, or the center of gravity (center of mass) of the container.

As shown in FIG. 6, the large container B2 includes three large container supported parts B2g distributed on the bottom surface thereof, based on a SEMI standard (E158). Each of the large container supported parts B2g is formed in the shape of a long groove extending radially from the center of the bottom surface of the large container B2 in plan view. Each of the large container supported parts B2g is formed so as to be recessed to the inner side of the container toward the central portion of its groove-shaped portion, and the peripheral edge portion of the groove-shaped portion is configured to be continuous with a bottom surface B2m of the large container B2 without any level difference. The three large container supported parts B2g include a pair of large container forward supported parts B2ga spaced apart in the lateral width direction of the large container B2 and a large container rearward supported part B2gb located at a position that is at a central portion in the lateral width direction of the large container B2 and is spaced toward the rear of the large container B2 relative to the pair of large container forward supported parts B2ga. The pair of large container forward supported parts B2ga are disposed forward of the center of the large container B2 in plan view, and the large container rearward supported part B2gb is disposed rearward of the center of the large container B2 in plan view.

As shown in FIG. 6, the large container B2 is configured to be wider than the small container B1 in the lateral width direction.

In addition, the pair of small container forward supported parts B1ga in a state in which the support body J, which will be described later, supports the small container B1 are configured to be located inward, in plan view, of the pair of large container forward supported parts B2ga in the lateral width direction (the lateral width direction of the support body J) of the container B (small container B1, large container B2) in a state in which the support body J supports the large container B2.

As shown in FIGS. 1 and 2, an elevation guide mast M2 extending along the vertical direction is provided in the interior of the substrate container storage facility ST, and an elevation body K is supported so as to be capable of moving up and down along the elevation guide mast M2. The elevation body K is suspended from and supported by a wire W, and is configured to be capable of being moved up and down by operating an elevation driver V1 that winds and unwinds the wire W. In addition, the support body J capable of supporting the container B is supported by the elevation body K via a swing arm YA and a pivot driver Y1.

The pivot driver Y1 is configured to cause the support body J to pivot about a support fulcrum in plan view. In addition, the swing arm YA is swung by an arm driver V2 so as to be able to adjust the position of the pivot driver Y1 relative to the elevation body K.

In the present embodiment, the elevation driver V1, the pivot driver Y1, the swing arm YA, the arm driver V2, and the support body J constitute the transfer unit Y, and the elevation driver V1, the pivot driver Y1, the swing arm YA, and the arm driver V2 constitute the movement operation part. Accordingly, the transfer unit Y includes a movement operation part that moves the support body J at least in the vertical direction.

As shown in FIG. 3, a base 13 extending from the pivot driver Y1 on opposite sides in the lateral width direction is attached to the pivot driver Y1, and a protrusion 10 having a planar shape and protruding in the horizontal direction from the base 13 is provided at the central portion of the base 13 in the lateral width direction.

In other words, the support body J includes the base 13 to which the movement operation part is connected, and the protrusion 10 that protrudes in the horizontal direction from the base 13 and passes through the notch 20k in the vertical direction when the container B is transferred.

Figure 5:
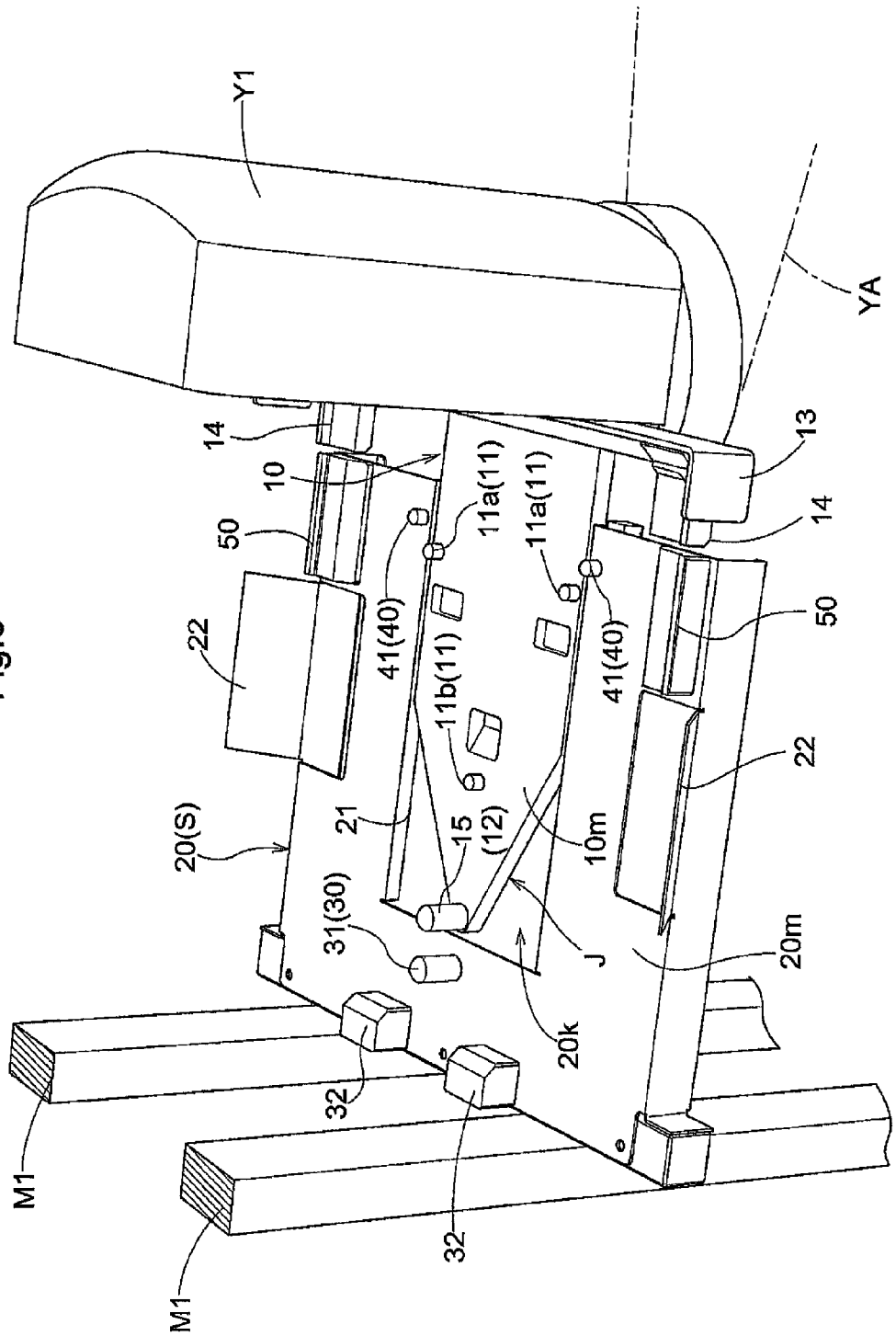
FIG. 5 is a perspective view showing a positional relationship between the support body and the placement body during delivery and reception of a container.

As shown in FIG. 3, the protrusion 10 is configured to have a rectangular shape near the base 13 and a triangular shape near the tip in plan view. Also, as shown in FIG. 5, the dimension of the rectangular portion in the lateral width direction is configured to be narrower than the dimension of the notch 20k of the placement body S in the lateral width direction.

The transfer unit Y is configured to be capable of aligning the protruding direction of the protrusion 10 with the recessed direction of the notch 20k of the placement body S by operating the pivot driver Y1 and the arm driver V2. As described above, the dimension of the rectangular portion of the protrusion 10 in the lateral width direction is smaller than the dimension of the notch 20k of the placement body S in the lateral width direction, and therefore, the protrusion 10 can pass through the notch 20k of the placement body S in the vertical direction.

In addition, as shown in FIG. 6, the lateral width of the protrusion 10 is formed to be narrower than the lateral width of the container B (small container B1, large container B2).

As shown in FIGS. 2, 3, 5, and 6, a support body-side edge supporting part 14 that supports an edge of the bottom surface of the large container B2 near the base 13 is provided at each of opposite ends of the base 13 in the lateral width direction.

As shown in FIG. 3, in the present embodiment, a plurality of the support body-side edge supporting parts 14 are distributed in the lateral width direction of the support body J. Also, the plurality of support body-side edge supporting parts 14 are provided so as to support portions of the edge of the bottom surface of the large container B2 near the base 13, the portions being located on opposite sides with respect to the protrusion 10 in the lateral width direction of the support body J. In the present example, two support body-side edge supporting parts 14 are provided so as to support opposite corners of the bottom surface B2*m* of the large container B2 near the base 13 (opposite ends in the lateral width direction, or portions in the vicinity thereof). Also, in the present example, the support body-side edge supporting parts 14 each include a placement surface 14*a* on which the bottom surface B2*m* of the large container B2 is placed and supported, and a first inclined surface 14*b* and a second inclined surface 14*c* that guide the bottom of the large container B2 when the large container B2 is transferred to the support body J, as shown in FIG. 3.

The protrusion 10 includes three support body-side small container supporting parts 11 that support the bottom surface B1*m* of the small container B1 by engaging with the three small container supported parts B1*g* of the small container B1 in a state in which the small container B1 is positioned at a transfer position in the support body. The three support body-side small container supporting parts 11 include a pair of small container forward supporting parts 11*a* for engaging with the pair of small container forward supported parts B1*ga* and a small container rearward supporting part 11*b* for engaging with the small container rearward supported part B1*gb*.

Furthermore, a support body-side large container supporting part 15 that supports the large container rearward supported part B2*gb* of the large container B2 is provided at the tip of the protrusion 10.

The support body J is configured to support the large container B2 with the support body-side edge supporting parts 14 and the support body-side large container supporting part 15.

In the present embodiment, the support body-side small container supporting parts 11, the support body-side edge supporting parts 14, and the support body-side large container supporting part 15 correspond to support body-side supporting parts 12.

In other words, the support body J that supports from below the container B in which an opening for placing a semiconductor substrate in and out is disposed at the front thereof is provided, and the support body J includes, as the support body-side supporting parts 12, the three support body-side small container supporting parts 11 that support the three small container supported parts B1*g* located on the bottom surface B1*m* of the small container B1 and the support body-side edge supporting parts 14 that support an edge of the outer periphery of the bottom surface B2*m* of the large container B2 near the base 13.

Accordingly, the support body J supports the bottom surface of the container B in a state in which the container B (small container B1, large container B2) is positioned at the transfer position in the support body J.

Figure 7:
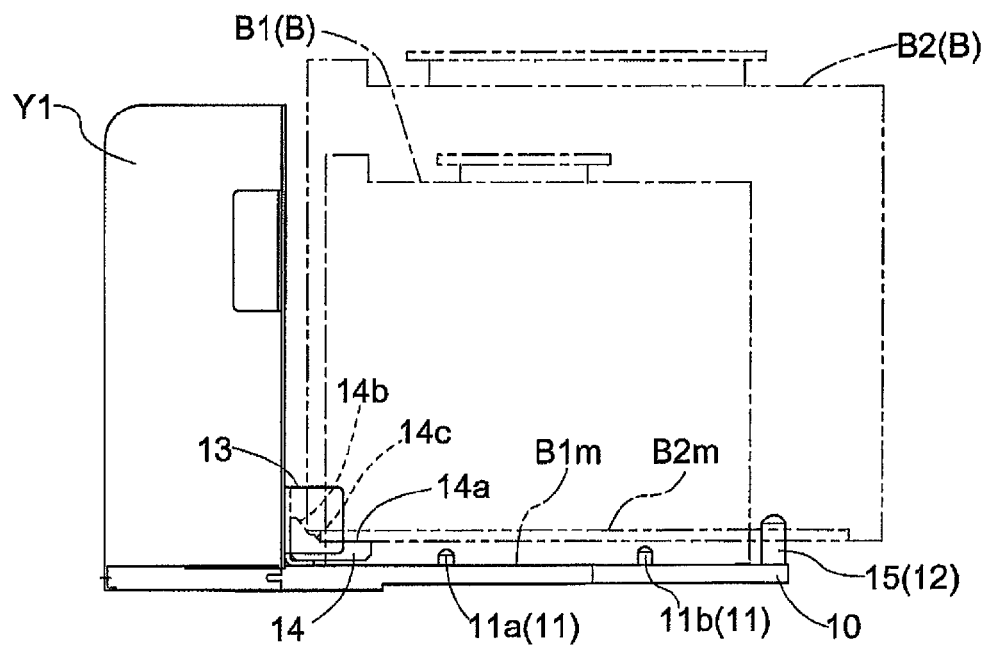
FIG. 7 is a side view showing the positional relationship between the support body and the large container and the small container that are supported by the support body.
Figure 8:
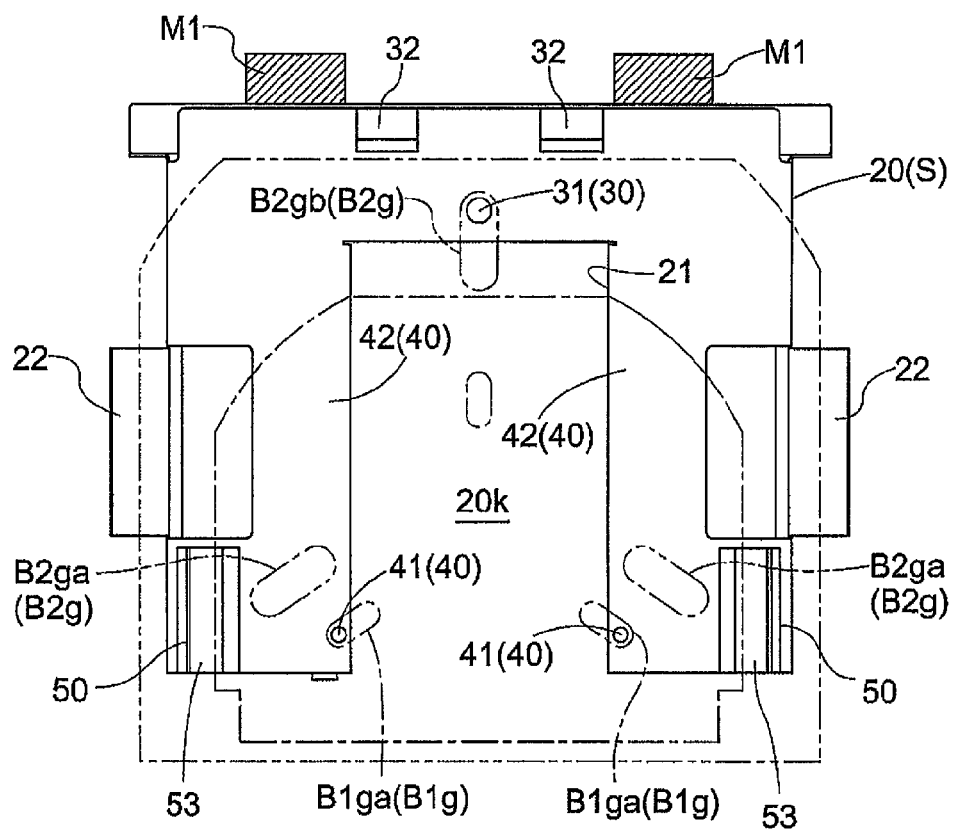
FIG. 8 is a plan view showing a positional relationship between the placement body and a large container and a small container that are supported by the placement body.

As shown in FIG. 7, the support body-side edge supporting parts 14 and the support body-side large container supporting part 15 are configured to support the large container B2 at a height at which the bottom surface B2*m* of the large container B2 is located above the upper ends of the support body-side small container supporting parts 11.

Next is a description of the configuration of the placement body S. As shown in FIG. 4, the placement body S is provided with a pair of placement surfaces 42 that are provided so as to be spaced apart on opposite sides of the notch 20*k* of the placement body S in the lateral width direction of the placement body S in plan view and that support the bottom surface B1*m* of the small container B1 from below, and a pair of small container engaging parts 41 for engaging with the pair of small container forward supported parts B1*ga* of the small container B1. As shown in FIG. 5, the interval between the pair of small container engaging parts 41 is wider than the interval between the pair of small container forward supporting parts 11*a*. In addition, small/large container positioning and supporting members 50 are provided outward of the pair of placement surfaces 42 in the lateral width direction of the placement body S. Furthermore, a large container rearward supporting part 31 that supports the large container rearward supported part B2*gb* of the large container B2 is provided at a portion that is located at the central portion of the notch 20*k* in the lateral width direction of the placement body S and on the deeper side than the notch 20*k* in the depth direction. Furthermore, a pair of large container front-rear positioning blocks 32 are provided so as to be spaced apart in the lateral width direction of the placement body S, on the deeper side than the large container rearward supporting part 31. The large container front-rear positioning blocks 32 each include an inclined surface 32*c* that is inclined such that the forward side of the placement body S is located at a lower position than the rear side thereof.

At opposite ends, in the lateral width direction, of the plate-shaped member 20 constituting the placement body S, inclined parts 22 are provided in such a manner that the plate-shaped member 20 is punched and bent. Each of the inclined parts 22 is formed such that its outer side in the lateral width direction is located at a higher position.

Each of the pair of small/large container positioning and supporting members 50 includes a restriction surface 51 that is formed as a vertical surface on the innermost side in the direction of alignment of the pair of small/large container positioning and supporting members 50 (hereinafter simply referred to as "alignment direction"), a guiding inclined part 52 extending continuously and obliquely from the highest portion of the restriction surface 51 in the vertical direction to the outer side in the alignment direction, a placement surface 53 extending continuously and horizontally from the highest portion of the guiding inclined part 52 in the vertical direction to the outer side in the alignment direction, a restriction surface 54 extending continuously from the outer portion of the placement surface 53 in the alignment direction so as to stand upright as a vertical surface, and a guiding inclined part 55 extending continuously and obliquely from the highest portion of the restriction surface 54 in the vertical direction to the outer side in the alignment direction. Note that in the present embodiment, each of the pair of small/large container positioning and supporting members 50 is formed by cutting a metal member.

In the present embodiment, a small container positioning member and a large container supporting and positioning member, which will be described later, are formed by the small/large container positioning and supporting member 50, which is a single member.

In the following, a description will be given of an example in which the container B supported by the support body J is transferred to the placement body S in the present embodiment, separately for a case where the container B to be transferred is the small container B1 and a case where the container B to be transferred is the large container B2.

First, a description will be given of the case where the small container B1 supported by the support body J is transferred to the placement body S.

As shown in FIGS. 6 and 7, the small container B1 is supported by the support body J in an orientation in which the front-to-rear direction of the small container B1 extends along the protruding direction of the protrusion 10, and in a state in which the small container B1 is positioned at a small container set placement position (indicated by the dashed dotted line in FIG. 6) in plan view.

At this time, the small container supported parts B1g provided on the bottom surface B1m of the small container B1 are engaged with the support body-side small container supporting parts 11 provided on the support body J.

Then, when the small container B1 supported by the support body J is transferred to the placement body S, the pivot driver Y1, the swing arm YA, and the arm driver V2 are operated such that the protrusion 10 of the support body J that supports the small container B1 is located at a position overlapping in plan view with the notch 20k of the placement body S, and the elevation driver V1 is operated such that the protrusion 10 of the support body J that supports the small container B1 passes through the notch 20k of the placement body S downwardly.

Consequently, the small container B1 supported by the support body J is supported by the pair of placement surfaces 42 provided on the placement body S. In a state in which the small container B1 is supported by the placement body S, the restriction surfaces 51 included in the pair of small/large container positioning and supporting members 50 restrict movement of the small container B1 in the lateral width direction by coming into contact with the left and right side portions of the small container B1.

In the present embodiment, the small/large container positioning and supporting members 50 including the restriction surfaces 51 and the guiding inclined parts 52 correspond to small container positioning members. Accordingly, a pair of small container positioning members are provided on the placement body S so as to be spaced apart in the lateral width direction of the placement body S.

In the present embodiment, the pair of placement surfaces 42, the pair of small container engaging parts 41, and the pair of small container positioning members correspond to placement body-side small container supporting parts 40.

In other words, the placement body-side small container supporting parts 40 include the pair of placement surfaces 42 that are provided so as to be spaced apart on opposite sides of the notch 20k of the placement body S in the lateral width direction of the placement body S in plan view and that support the bottom surface B1m of the small container B1 from below, the pair of small container engaging parts 41 for engaging with the pair of small container forward supported parts B1ga, and the pair of small/large container positioning and supporting members 50. Also, each of the small/large container positioning and supporting members 50 includes the restriction surface 51 that restricts movement of the small container B1 along the lateral width direction by coming into contact with a side portion of the small container, and the guiding inclined part 52 that guides an end of the bottom surface B1m of the small container B1 in the lateral width direction to position the small container B1 at the small container set placement position in the lateral width direction.

Note that in a state before the transfer, the small container B1 supported by the support body J may be located at a position displaced from the small container set placement position in the placement body S. In such a case, as the support body J is lowered, the small container B1 is guided to the small container set placement position such that the inner surfaces of the recessed portions of the pair of small container forward supported parts B1ga are guided by the upper ends of the left-and-light pair of small container engaging parts 41, and that opposite ends of the bottom surface B1m of the small container B1 in the lateral width direction of the container are guided by the guiding inclined parts 52.

Next is a description of the case where the large container B2 supported by the support body J is transferred to the placement body S.

As shown in FIGS. 6 and 7, the large container B2 is supported by the support body J in an orientation in which the front-to-rear direction of the large container B2 extends along the protruding direction of the protrusion 10, and in a state in which the large container B2 is positioned at a large container set placement position (indicated by the dashed double-dotted line in FIG. 6) in plan view.

At this time, of the three large container supported parts B2g provided on the bottom surface B2m of the large container B2, the large container rearward supported part B2gb on the rear side of the container is supported by the support body-side large container supporting part 15 provided on the support body J. In addition, an edge of the outer periphery of the bottom surface B2m of the large container B2 near the base 13 is supported by the pair of support body-side edge supporting parts 14.

Then, the pivot driver Y1, the swing arm YA, and the arm driver V2 are operated such that the protrusion 10 of the support body J that supports the large container B2 is located at a position overlapping in plan view with the notch 20k of the placement body S, and the elevation driver V1 is operated such that the protrusion 10 of the support body J that supports the large container B2 passes through the notch 20k of the placement body S downwardly.

Consequently, the large container B2 supported by the support body J is supported by the placement surfaces 53 of the pair of small/large container positioning and supporting members 50 provided on the placement body S and the large container rearward supporting part 31. In a state in which the large container B2 is supported by the placement body S, the restriction surfaces 54 included in the pair of small/large container positioning and supporting members 50 restrict movement of the large container B2 in the lateral width direction by coming into contact with the left and right side portions of the large container B2.

Figure 9:
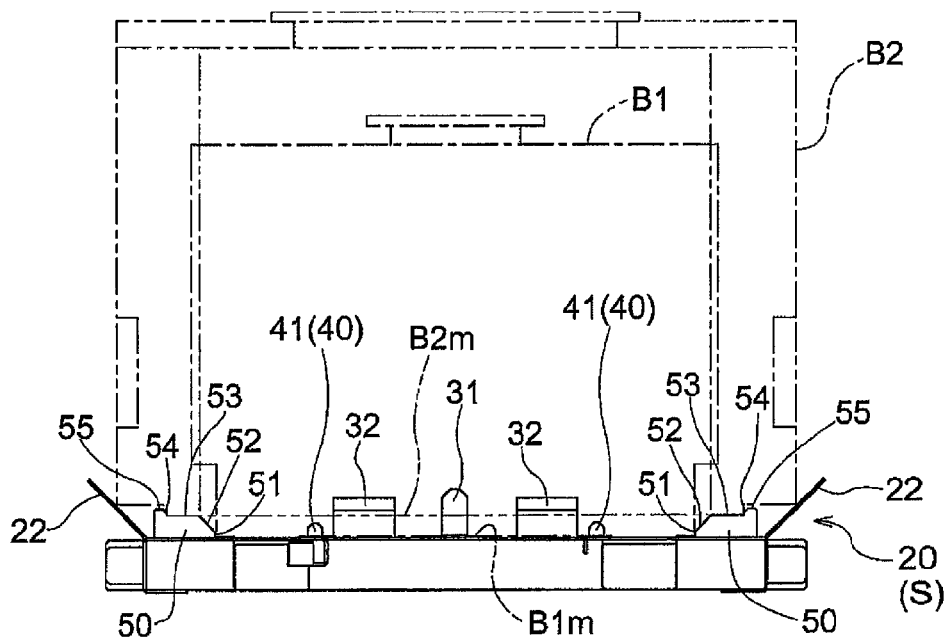
FIG. 9 is a front view showing the positional relationship between the placement body and the large container and the small container that are supported by the placement body.
Figure 10:
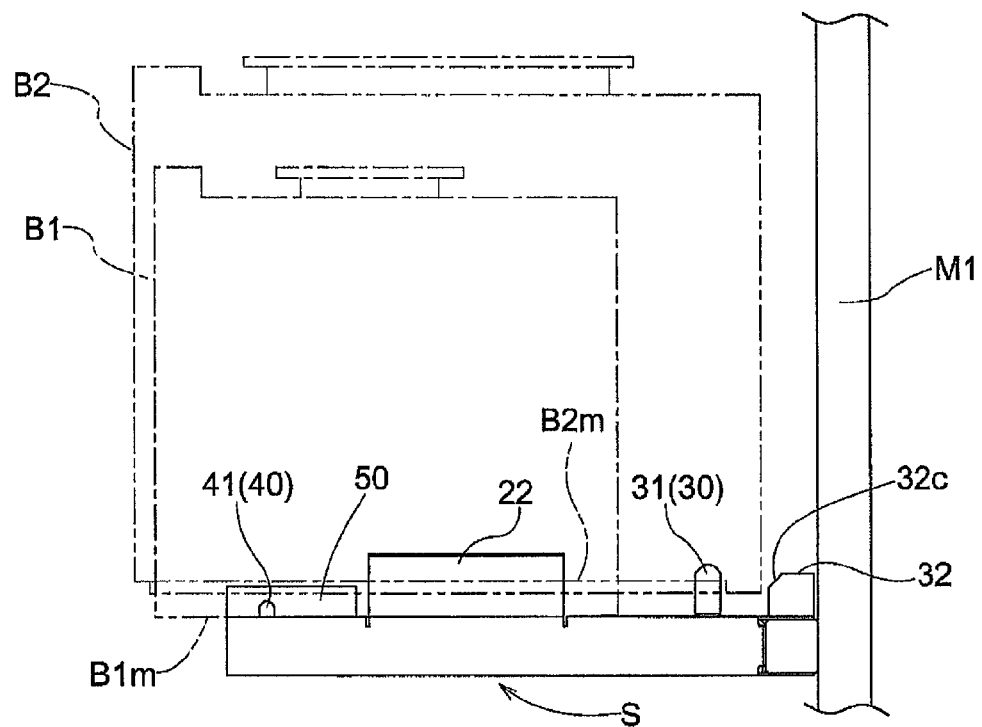
FIG. 10 is a side view showing the positional relationship between the placement body and the large container and the small container that are supported by the placement body.
Figure 11:
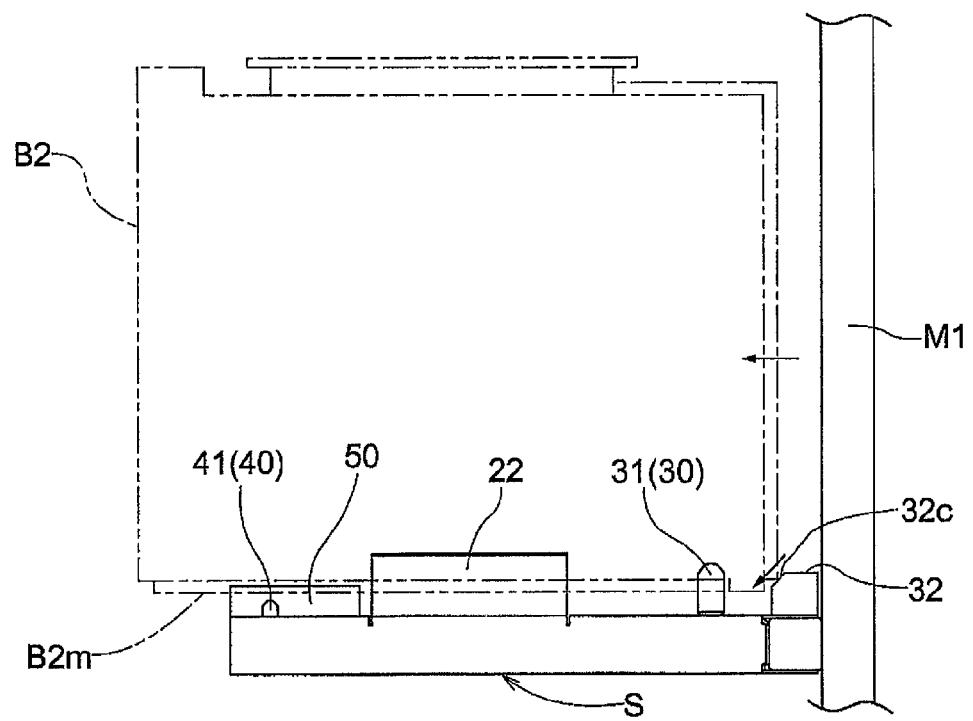
FIG. 11 is a side view showing a guided state of the large container when the large container is transferred to the placement body.

In addition, as shown in FIGS. 9 and 10, the placement surfaces 53 of the small/large container positioning and supporting members 50 and the large container rearward supporting parts 31 are configured to support the large container B2 at a height at which the bottom surface B2m of the large container B2 is located above the upper ends of the small container engaging parts 41.

In the present embodiment, the small/large container positioning and supporting members 50 including the placement surfaces 53, the restriction surfaces 54, and the guiding inclined parts 55 correspond to large container supporting and positioning members. Accordingly, a pair of large container supporting and positioning members are provided on the placement body S so as to be spaced apart in the lateral width direction of the placement body S.

In the present embodiment, the large container rearward supporting part 31 and the pair of large container supporting and positioning members correspond to placement body-side large container supporting parts 30. In other words, the placement body-side large container supporting parts 30 include the large container rearward supporting part 31 and the pair of small/large container positioning and supporting members 50.

The large container rearward supporting part 31 is configured to support the large container rearward supported part B2gb.

Also, each of the pair of small/large container positioning and supporting members 50 includes the placement surface 53 that supports the bottom surface B2*m* of the large container B2, the restriction surface 54 that restricts movement of the large container B2 along the lateral width direction by coming into contact with a side portion of the large container B2, and the guiding inclined part 55 that guides an end of the bottom surface B2*m* of the large container B2 in the lateral width direction to position the large container B2 at the large container set placement position in the lateral width direction.

Note that when the large container B2 is transferred from the support body J to the placement body S, the support body J may be displaced in plan view from a proper position corresponding to the large container set placement position because of insufficient accuracy of movement by the movement operation part, for example. In such a case, the large container B2 supported by the support body J is guided to the large container set placement position as follows.

Specifically, as the support body J is moved downwardly to pass through the notch 20*k*, bulged portions formed on side portions of the large container B2 are guided in the lateral width direction by the inclined parts 22, and opposite ends of the bottom surface B2*m* of the large container B2 in the lateral width direction of the container are guided in the lateral width direction by the guiding inclined parts 55. Thus, the large container B2 is guided to the large container set placement position in the lateral width direction.

Further, as the support body J is moved downwardly to pass through the notch 20*k*, the rear ends of the bottom surface B2*m* of the large container B2 in the front-rear direction of the container are guided in the front-rear direction by the inclined surfaces 32*c* of the large container front-rear positioning blocks 32. Thus, the large container B2 is guided to the large container set placement position in the front-rear direction.

Thus, in the present embodiment, the placement body S includes, as the placement body-side supporting parts, the placement body-side small container supporting parts 40 capable of supporting the bottom surface B1*m* of the small container B1 in a state in which the small container B1 is positioned at the small container set placement position, and the placement body-side large container supporting parts 30 capable of supporting the bottom surface B2*m* of the large container B2 in a state in which the large container B2 is positioned at the large container set placement position. In other words, the placement body S includes a plurality of placement body-side supporting parts distributed at different positions in the peripheral direction of the notch 20*k* (the direction along the peripheral edge of the notch 20*k*) in plan view.

Also, as a result of the protrusion 10 of the support body J that supports the container B passing through the notch 20*k* downwardly, the bottom surface of the container B (small container B1, large container B2) is received and supported, and the container B (small container B1, large container B2) is transferred from the support body J to the placement body S in a state in which the container B (small container B1, large container B2) is positioned by the plurality of placement body-side supporting parts relative to the placement body S in the lateral width direction.

Other Embodiments (1) In the above embodiment, a pair of the support body-side edge supporting parts 14 that support an edge of the outer periphery of the bottom surface of the large container B2 near the base 13 are provided so as to support opposite corners of the bottom surface B2*m* of the large container B2 near the base 13. However, the present invention is not limited to such a configuration, and the support body-side edge supporting parts 14 may be provided so as to support a plurality of positions located inward of the corners of the edge of the bottom surface B2*m* of the large container B2 near the base 13. In this case, the number of the support body-side edge supporting parts 14 may be three or more.

In the above embodiment, a configuration is adopted in which the support body-side edge supporting parts 14 are provided so as to support the opposite corners of the bottom surface B2*m* of the large container B2 near the base 13. However, it is possible to adopt a configuration in which the support body-side edge supporting parts 14 support the entire edge of the bottom surface B2*m* of the large container B2 near the base 13 across the lateral width direction.

(2) The above embodiment illustrates an example in which a small container positioning member and a large container supporting and positioning member are formed by the small/large container positioning and supporting member 50, which is a single member. However, the small container positioning member and the large container supporting and positioning member may be formed as separate members.

(3) The above embodiment illustrates a configuration in which the support body-side large container supporting part 15 that supports the large container supported part B2*g* of the large container B2 when the rear side of the large container B2 is supported on the support body J is provided at the tip of the protrusion 10 of the support body J. However, the present invention is not limited to such a configuration, and the supporting part that supports the rear side of the large container B2 may be configured such that the bottom surface B2*m* of the large container B2 is placed on and supported by the supporting part.

(4) The above embodiment illustrates a configuration including, as the placement body-side small container supporting parts 40, the pair of placement surfaces 42 formed on opposite sides of the notch 20*k* of the placement body S in the lateral width direction, the pair of small container engaging parts 41 for engaging with the pair of small container forward supported parts B1*ga*, and the pair of small container positioning members, each of the small container positioning members including the restriction surface 51 that restricts movement of the small container in the lateral width direction by coming into contact with a side portion of the small container, and the guiding inclined part 52 that guides an end of the bottom surface of the small container B1 in the lateral width direction to position the small container B1 at the small container set placement position in the lateral width direction of the placement body S. However, it is possible to adopt a configuration in which the small container engaging parts 41 are omitted from the above-described configuration. It is also possible to omit the guiding inclined parts 52 when the accuracy of movement of the protrusion 10 by the pivot driver Y1, the swing arm YA, and the arm driver V2 is sufficient.

(5) The above embodiment illustrates a configuration including, as the placement body-side large container supporting parts 30, the large container rearward supporting part 31 that supports the large container rearward supported part B2*gb* and the pair of large container supporting and positioning members, each of the large container supporting and positioning members including the placement surface 53 that support the bottom surface B2*m* of the large container B2 from below, the restriction surface 54 that restricts movement of the large container B2 in the lateral width direction by coming into contact with a side portion of the large container B2, and the guiding inclined part 55 that guides an end of the bottom surface B2m of the large container B2 in the lateral width direction to position the large container B2 at the large container set placement position in the lateral width direction. However, it is possible to adopt a configuration in which the guiding inclined parts 55 are omitted from the above-described configuration when the accuracy of movement of the protrusion 10 by the pivot driver Y1, the swing arm YA, and the arm driver V2 is sufficient.

(6) The above embodiment illustrates an example in which the placement body-side large container supporting parts 30 are configured to support the large container B2 at a height at which the bottom surface B2m of the large container B2 is located above the upper ends of the small container engaging parts 41. However, the height of the bottom surface B2m of the large container B2 is not limited to the above-described height as long as the small container engaging parts 41 and the bottom surface B2m of the large container B2 do not interfere with each other.

(7) Although the above embodiment describes a case where the container transport facility is used in the semiconductor container storage facility, the present invention is not limited to such a configuration. The container transport facility according to the present invention can be used in various facilities other than the semiconductor container storage facility. For example, it is possible to adopt configuration in which a load port in the semiconductor processing facility is provided with the placement body S, and a transport device that transports the container B to the load port is provided with the support body J.

The invention claimed is:

1. A container transport facility comprising:
a transfer unit including a support body and a movement operation part that moves the support body at least in a vertical direction, the support body supports a container from below, the container defines an opening at a front end for placing a semiconductor substrate in and out of the container; and
a plate-shaped placement body as a transfer target location to which the container is transferred by the transfer unit,
wherein the support body includes support body-side supporting parts that support a bottom surface of the container in a state in which the container is positioned at a transfer position in the support body,
the placement body includes a notch having a recessed shape in plan view and a plurality of placement body-side supporting parts distributed at different positions in a direction along a peripheral edge of the notch in plan view, and is configured to receive and support the bottom surface of the container in a state in which the container is positioned relative to the placement body in a lateral width direction by the plurality of placement body-side supporting parts as a result of a portion of the support body that supports the container passing through the notch downwardly,
the support body includes a base to which the movement operation part is connected, and a protrusion that protrudes from the base in a horizontal direction and passes through the notch in the vertical direction when the container is transferred, and is configured to support the container in an orientation in which a front-to-rear direction of the container extends along a protruding direction of the protrusion,
a lateral width of the protrusion is formed to be narrower than a lateral width of the container,
the container comprises either a first container or a second container configured to be wider than the first container in the lateral width direction, wherein the transfer unit is configured to transfer the first container and, separately, the second container,
the first container includes three first container supported parts distributed on a bottom surface thereof, the three first container supported parts including a pair of first container forward supported parts spaced apart in a lateral width direction of the first container and a first container rearward supported part located at a position that is at a central portion in the lateral width direction of the first container and is spaced toward a rear of the first container relative to the pair of first container forward supported parts,
the second container includes three second container supported parts distributed on a bottom surface thereof, the three second container supported parts including a pair of second container forward supported parts spaced apart in a lateral width direction of the second container and a second container rearward supported part located at a position that is at a central portion in the lateral width direction of the second container and is spaced toward a rear of the second container relative to the pair of second container forward supported parts,
the pair of first container forward supported parts in a state in which the support body supports the first container are located inward, in plan view, of the pair of second container forward supported parts in a lateral width direction of the support body in a state in which the support body supports the second container, and
the support body includes, as the support body-side supporting parts for the first container, three support body-side first container supporting parts that support the three first container supported parts located on the bottom surface of the first container and, as the support body-side supporting parts for the second container, a plurality of support body-side edge supporting parts that support portions of an edge of an outer periphery of the bottom surface of the second container near the base and a support body-side second container supporting part provided at a tip of the protrusion that supports the second container rearward supported part of the second container,
the portions being located on opposite sides with respect to the protrusion in the lateral width direction of the support body,
the plurality of the support body-side edge supporting parts each include a placement surface on which the bottom surface of the second container is placed, and
the placement surface is positioned above a top surface of the protrusion.

2. The container transport facility according to claim 1, wherein the plurality of the support body-side edge supporting parts are distributed in the lateral width direction of the support body.

3. The container transport facility according to claim 1, wherein the plurality of support body-side edge supporting parts and the support body-side second container supporting part are configured to support the second container at a height at which the bottom surface of the second container is located above upper ends of the support body-side first container supporting parts.

4. The container transport facility according to claim 1,
wherein the placement body includes, as the placement body-side supporting parts, placement body-side first container supporting parts capable of supporting the bottom surface of the first container in a state in which the first container is positioned at a first container set placement position,
the placement body-side first container supporting parts include a pair of placement surfaces that are provided so as to be spaced apart on opposite sides of the notch of the placement body in the lateral width direction of the placement body in plan view and that support the bottom surface of the first container from below, a pair of first container engaging parts for engaging with the pair of first container forward supported parts, and a pair of first container positioning members, and
the first container positioning members each include a restriction surface that restricts movement of the first container along the lateral width direction of the placement body by coming into contact with a side portion of the first container, and a guiding inclined part that guides an end of the bottom surface of the first container in the lateral width direction to position the first container at the first container set placement position in the lateral width direction of the placement body.

5. The container transport facility according to claim 4,
wherein the placement body includes, as the placement body-side supporting parts, placement body-side second container supporting parts capable of supporting the bottom surface of the second container in a state in which the second container is positioned at a second container set placement position,
the placement body-side second container supporting parts include a pair of second container supporting and positioning members that are provided so as to be spaced apart on opposite sides of the notch of the placement body in the lateral width direction of the placement body in plan view and that support a pair of supported locations of the bottom surface of the second container that are spaced apart in the lateral width direction of the second container, and a second container rearward supporting part that supports the second container rearward supported part, and
the second container supporting and positioning members each include a placement surface that supports the bottom surface of the second container from below, a restriction surface that restricts movement of the second container along the lateral width direction of the placement body by coming into contact with a side portion of the second container, and a guiding inclined part that guides an end of the bottom surface of the second container in the lateral width direction to position the second container at the second container set placement position in the lateral width direction of the placement body.

6. The container transport facility according to claim 5,
wherein the placement body-side second container supporting parts are configured to support the second container at a height at which the bottom surface of the second container is located above upper ends of the first container engaging parts.

7. The container transport facility according to claim 5,
wherein the pair of first container positioning members and the pair of second container supporting and positioning members are formed by a single pair of members.

* * * * *